United States Patent
Handley et al.

(10) Patent No.: US 10,656,663 B2
(45) Date of Patent: *May 19, 2020

(54) APPARATUSES INCLUDING UTILITY METER, POWER ELECTRONICS, AND COMMUNICATIONS CIRCUITRY, AND RELATED METHODS OF OPERATION

(71) Applicant: Duke Energy Corporation, Charlotte, NC (US)

(72) Inventors: Jason Handley, Waxhaw, NC (US); Stuart Laval, Fort Mill, SC (US); Aleksandar Vukojevic, Harrisburg, NC (US)

(73) Assignee: Duke Energy Coporation, Charlotte, NC (US)

(*) Notice: Subject to any disclaimer, the term of this patent is extended or adjusted under 35 U.S.C. 154(b) by 119 days.

This patent is subject to a terminal disclaimer.

(21) Appl. No.: 15/793,694

(22) Filed: Oct. 25, 2017

(65) Prior Publication Data
US 2018/0046208 A1  Feb. 15, 2018

Related U.S. Application Data

(63) Continuation of application No. 14/870,126, filed on Sep. 30, 2015, now Pat. No. 9,829,899.

(60) Provisional application No. 62/077,675, filed on Nov. 10, 2014.

(51) Int. Cl.
| | |
|---|---|
| *G01R 19/165* | (2006.01) |
| *G05F 1/00* | (2006.01) |
| *H02J 13/00* | (2006.01) |
| *G01D 4/00* | (2006.01) |
| *H02J 3/00* | (2006.01) |

(Continued)

(52) U.S. Cl.
CPC .............. *G05F 1/00* (2013.01); *G01D 4/004* (2013.01); *H02J 3/00* (2013.01); *H02J 13/0006* (2013.01); *G01R 22/063* (2013.01); *G01R 22/10* (2013.01); *Y02B 90/242* (2013.01); *Y04S 20/322* (2013.01)

(58) Field of Classification Search
USPC .............................................. 324/142, 76.11
See application file for complete search history.

(56) References Cited

U.S. PATENT DOCUMENTS

| | | |
|---|---|---|
| 5,642,007 A | 6/1997 | Gyugyi et al. |
| 6,281,601 B1 | 8/2001 | Edelman et al. |
| 6,952,092 B2 | 10/2005 | Wood |

(Continued)

FOREIGN PATENT DOCUMENTS

CN          103248068 A      8/2013

*Primary Examiner* — Vincent Q Nguyen
(74) *Attorney, Agent, or Firm* — Myers Bigel, P.A.

(57) ABSTRACT

Apparatuses including utility meter, power electronics, and communications circuitry are provided. The utility meter circuitry is configured to measure usage of electricity supplied by an electric utility to a premise of a customer of the electric utility. The power electronics circuitry is configured to regulate a voltage level supplied to the premise of the customer. Moreover, the communications circuitry is configured to provide communications with a first electronic device of the customer at the premise of the customer and to provide communications with a second electronic device that is upstream from the apparatus. Related methods of operating an apparatus including utility meter, power electronics, and communications circuitry are also provided.

23 Claims, 9 Drawing Sheets

(51) Int. Cl.
   *G01R 22/06*         (2006.01)
   *G01R 22/10*         (2006.01)

(56)              References Cited

U.S. PATENT DOCUMENTS

| | | | |
|---|---|---|---|
| 7,687,935 | B2 | 3/2010 | Bailey |
| 7,834,480 | B2 | 11/2010 | Mandalakas et al. |
| 8,373,303 | B1 * | 2/2013 | Daniels ............... H02J 7/35 307/23 |
| 2003/0205938 | A1 | 11/2003 | Andarawis et al. |
| 2008/0263469 | A1 | 10/2008 | Nasle et al. |
| 2010/0007522 | A1 | 1/2010 | Morris |
| 2010/0061028 | A1 | 3/2010 | Lestician |
| 2012/0022713 | A1 | 1/2012 | Deaver, Sr. et al. |
| 2012/0104850 | A1 | 5/2012 | Fallis et al. |
| 2012/0197455 | A1 | 8/2012 | Lee et al. |
| 2012/0229077 | A1 | 9/2012 | Tsuchiya |
| 2013/0155732 | A1 | 6/2013 | Wagoner et al. |
| 2013/0193868 | A1 | 8/2013 | Bueno et al. |
| 2013/0305071 | A1 | 11/2013 | Nilsen et al. |
| 2013/0334880 | A1 | 12/2013 | Jerphagnon |
| 2014/0039699 | A1 | 2/2014 | Forbes, Jr. |
| 2014/0285000 | A1 * | 9/2014 | Vonroth ............ A01B 59/00 307/9.1 |
| 2015/0311711 | A1 * | 10/2015 | Okabe ................ H02J 3/00 700/298 |

\* cited by examiner

APPARATUSES INCLUDING UTILITY METER, POWER ELECTRONICS, AND COMMUNICATIONS CIRCUITRY, AND RELATED METHODS OF OPERATION

CLAIM OF PRIORITY

The present application is a continuation application of and claims priority to U.S. patent application Ser. No. 14/870,126, filed Sep. 30, 2015, which claims the benefit of U.S. Provisional Patent Application No. 62/077,675, filed Nov. 10, 2014, the disclosures of which are hereby incorporated herein in their entirety by reference.

FIELD

The present disclosure relates to utility meters and power electronics.

BACKGROUND

An electric utility may measure electricity usage of a customer via a utility meter that is adjacent the customer's premise. For example, the meter may be on the outside of the customer's home or business. Manually reading data at the physical location of the meter, however, may be inefficient and untimely. Moreover, although an electric utility substation may adjust power levels that it provides to a group of customers, such adjustments may be imprecise with respect to the needs of individual customers within the broader group.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the present inventive concepts.

Various embodiments of the present inventive concepts include an apparatus including electric utility meter circuitry, power electronics circuitry, and communications circuitry. The electric utility meter circuitry may be configured to measure usage of electricity supplied by an electric utility to a premise of a customer of the electric utility. The power electronics circuitry may be configured to regulate a voltage level supplied to the premise of the customer. Moreover, the communications circuitry may be configured to provide communications with a first electronic device of the customer at the premise of the customer and to provide communications with a second electronic device that is upstream from the apparatus (e.g., spaced apart from the premise of the customer and connected to an electric grid or adjacent an electric grid device or transformer that is connected to the electric grid).

According to various embodiments, the voltage level that the power electronics circuitry is configured to regulate may be 600 Volts or lower. In some embodiments, the voltage level that the power electronics circuitry is configured to regulate may be 120 Volts and/or 240 Volts. Moreover, the electric utility meter circuitry may be configured to operate with a load from the premise of the customer that is between 0 Volt-Amperes and 15,000 Volt-Amperes.

In various embodiments, the power electronics circuitry may include a Direct Current (DC) bus configured to interface with a DC load and/or a DC power source at the premise of the customer. In some embodiments, the power electronics circuitry may include power inverter circuitry that is configured to convert DC power received from the DC power source via the DC bus into Alternating Current (AC) power. Moreover, the DC bus may include a 400-Volt or higher DC input port. In some embodiments, the DC bus may include a DC output port of a 400-Volt or higher DC power source that is configured to provide DC power to the DC load. Moreover, the power electronics circuitry may include power inverter circuitry that is configured to convert Alternating Current (AC) power into DC power for the DC output port.

According to various embodiments, the communications circuitry may include a first communications interface configured to provide first communications with the first electronic device of the customer, and a second communications interface configured to provide second communications with the second electronic device that is upstream from the apparatus (e.g., spaced apart from the premise of the customer and connected to the electric grid or adjacent the electric grid device that is connected to the electric grid).

In various embodiments, the apparatus may be at the premise of the customer and spaced apart from (e.g., downstream from) a substation of the electric utility. The power electronics circuitry may be configured to regulate Volt-Amperes Reactive (VARs) provided to the premise of the customer. Moreover, the power electronics circuitry may be configured to adjust the voltage level by up to +/−10% and to adjust the VARs by up to +/−5%. In some embodiments, the power electronics circuitry may be configured to adjust the voltage level and the VARs for the premise of the customer independently of adjustments for any other premise of any other customer of the electric utility. In some embodiments, the apparatus may be spaced apart from (e.g., downstream from) a distribution transformer that serves the premise of the customer, and the power electronics circuitry may be configured to automatically hold the voltage level constant as long as the voltage level is within up to +/−10% of an incoming voltage from the distribution transformer. Alternatively, the power electronics circuitry may be configured to hold the voltage level within a predetermined voltage range. In some embodiments, the voltage level may be derived from a user input that is provided to the apparatus remotely via the communications circuitry. Moreover, in some embodiments, the apparatus is spaced apart from a circuit breaker box.

According to various embodiments, the apparatus may include bypass circuitry that is configured to bypass the power electronics circuitry and the communications circuitry. Moreover, the apparatus may be configured to connect between a utility secondary service of the electric utility and a wiring connection of the customer at the premise.

A method of operating an apparatus connected between a utility secondary service of an electric utility and a wiring connection of a customer at a premise of the customer, according to various embodiments, may be provided. The method may include measuring, using electric utility meter circuitry of the apparatus, usage of electricity supplied by the electric utility to the premise of the customer of the electric utility. The method may include regulating, using power electronics circuitry of the apparatus, a voltage level supplied to the premise of the customer. Moreover, the method may include providing communications, using communications circuitry of the apparatus, with a first electronic device of the customer at the premise of the customer and with a second electronic device that is upstream from the apparatus (e.g., spaced apart from the premise of the customer and connected to an electric grid or adjacent an electric grid device or transformer that is connected to the electric grid).

According to various embodiments, providing the communications may include providing first communications, via a first communications interface, with the first electronic device of the customer; and providing second communications, via a second communications interface, with the second electronic device that is upstream from the apparatus (e.g., spaced apart from the premise of the customer and connected to the electric grid or adjacent the electric grid device that is connected to the electric grid).

In various embodiments, regulating the voltage level may include adjusting the voltage level supplied to the premise of the customer independently of adjustments for any other premise of any other customer of the electric utility. In some embodiments, the method may include receiving, via the communications circuitry, a user input providing a command to hold the voltage level constant (or, alternatively, a command to hold the voltage level within a predetermined voltage range), where the apparatus is spaced apart from (e.g., downstream from) a distribution transformer that serves the premise of the customer, and where regulating the voltage level includes holding the voltage level constant as long as the voltage level is within up to +/−10% of an incoming voltage from the distribution transformer (or, alternatively, holding the voltage level within the predetermined voltage range), in response to receiving the user input.

According to various embodiments, the method may include receiving, via the communications circuitry, a user input providing a command to adjust the voltage level, where regulating the voltage level includes adjusting the voltage level in response to the user input. Moreover, in some embodiments, measuring the usage of electricity may include measuring the usage of electricity while bypassing use of the power electronics circuitry and/or the communications circuitry, in response to detecting an error, receiving a bypass command via the communications circuitry, and/or activation of a manual bypass switch of the apparatus.

It is noted that aspects of the present inventive concepts described with respect to one embodiment may be incorporated in a different embodiment although not specifically described relative thereto. That is, all embodiments and/or features of any embodiment can be combined in any way and/or combination. Applicants reserve the right to change any originally filed claim or file any new claim accordingly, including the right to be able to amend any originally filed claim to depend from and/or incorporate any feature of any other claim although not originally claimed in that manner. These and other objects and/or aspects of the present inventive concepts are explained in detail below.

BRIEF DESCRIPTION OF THE DRAWINGS

The accompanying drawings, which form a part of the specification, illustrate various embodiments of the present inventive concepts. The drawings and description together serve to fully explain embodiments of the present inventive concepts.

DETAILED DESCRIPTION

Figure 1A:
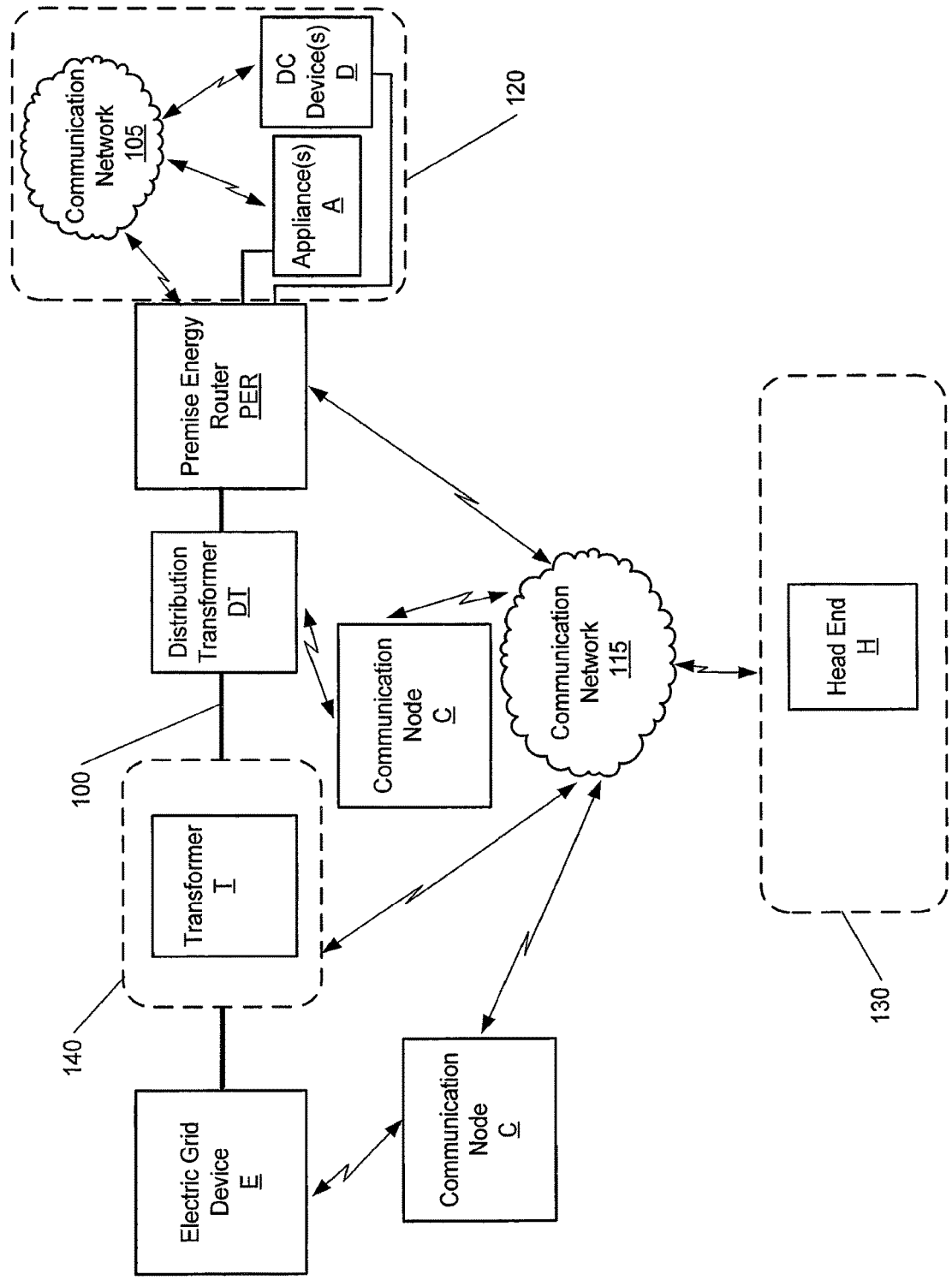
FIG. 1A is a schematic illustration of a premise energy router that is adjacent a premise of a customer of an electric utility, according to various embodiments.

Specific example embodiments of the present inventive concepts now will be described with reference to the accompanying drawings. The present inventive concepts may, however, be embodied in a variety of different forms and should not be construed as limited to the embodiments set forth herein. Rather, these embodiments are provided so that this disclosure will be thorough and complete and will fully convey the scope of the present inventive concepts to those skilled in the art. In the drawings, like designations refer to like elements. It will be understood that when an element is referred to as being "connected," "coupled," or "responsive" to another element, it can be directly connected, coupled or responsive to the other element or intervening elements may be present. Furthermore, "connected," "coupled," or "responsive" as used herein may include wirelessly connected, coupled, or responsive.

The terminology used herein is for the purpose of describing particular embodiments only and is not intended to be limiting of the present inventive concepts. As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. The symbol "/" is also used as a shorthand notation for "and/or."

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will also be understood that although the terms "first" and "second" may be used herein to describe various elements, these elements should not be limited by these terms. These terms are only used to distinguish one element from another element. Thus, a first element could be termed a second element, and similarly, a second element may be termed a first element without departing from the teachings of the present inventive concepts.

Example embodiments of the present inventive concepts may be embodied as nodes, devices, apparatuses, and methods. Accordingly, example embodiments of the present inventive concepts may be embodied in hardware and/or in software (including firmware, resident software, microcode, etc.). Furthermore, example embodiments of the present inventive concepts may take the form of a computer program product comprising a non-transitory computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, or device. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Example embodiments of the present inventive concepts are described herein with reference to flowchart and/or block diagram illustrations. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means and/or circuits for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the functions specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Although electric utility meters may be useful for measuring electricity usage by a customer of an electric utility, the communications and power-regulation functionality of electric utility meters may be limited or nonexistent. Various embodiments described herein, however, may replace an electric utility meter (e.g., a standalone/dedicated electric utility meter or any other device with electric utility meter functionality) with a premise energy router that includes power electronics for voltage regulation and/or Direct Current (DC) power and a communications platform that can provide communications both to a premise of a customer of an electric utility and to an electric grid. Accordingly, the power electronics and communications platform may be attached to the outside of the customer premise rather than upstream (e.g., at a substation or distribution transformer) from the customer premise. Moreover, the power electronics may use voltages of 120/240 Volts and may provide finer control/adjustment of voltages supplied to the customer premise.

Referring now to FIG. 1A, a schematic illustration is provided of a premise energy router PER that is adjacent a premise 120 of a customer of an electric utility, according to various embodiments. For example, the customer premise 120 may be a house, apartment, office, or other building, location, or structure, for which an electric utility meter could be provided for the customer. A customer premise 120 may thus be a structure such as a billboard, as well as a home or a business. Accordingly, the term "premise," as used herein, may be interchangeable with the term "premises," in that either term may be used herein to refer to a building, part of a building, or other structure for which an electric utility meter may be provided.

The premise energy router PER may provide electricity from an electric grid 100 to at least one device or appliance that is at the customer premise 120, and may measure electricity usage at the customer premise 120. For example, at least one appliance A may be at the customer premise 120 and be powered by the electric grid 100 through the premise energy router PER. An appliance A may be a refrigerator, dishwasher, laundry machine, oven, or any other large machine that uses electricity to perform, for example, cooking, cleaning, or food preservation functions in a household, institutional, commercial, or industrial setting. Although FIG. 1A illustrates one appliance A, in some embodiments, two, three, four, five, or more appliances may be at the customer premise 120.

Additionally or alternatively to the appliance(s) A, various devices that use electricity may be at the customer premise 120 and may be connected to the premise energy router PER. For example, consumer electronics and heating/cooling devices and/or systems may be at the customer premise 120. Moreover, in some embodiments, the customer premise 120 may be a billboard, and the electric grid 100 may provide power for lights or an electronic display of the billboard.

Additionally or alternatively, at least one DC device D may optionally be at the customer premise 120 and connected to the premise energy router PER. For example, the DC device(s) D may include an electric vehicle charging station, a Light Emitting Diode (LED) lighting system, or any other DC device.

Moreover, the premise energy router PER may communicate with multiple communication networks 105, 115. For example, the premise energy router PER may communicate with the appliance(s) A, the DC device(s) D, and/or another device that is at the customer premise 120, via the communication network 105. Additionally, the premise energy router PER may communicate with an electric utility substation 140 (which includes one or more transformers T), a communication node C, an electric grid device E including functionality of a communication node C, and/or a head end system H of an electric utility data center 130, via the communication network 115.

One or more communication nodes C may communicate with one or more electric grid devices E that are connected to the electric grid 100, using wireless communications (e.g., 3G/LTE, other cellular, WiFi, etc.) or wired communications (e.g., Power Line Carrier (PLC), Ethernet, serial, Universal Serial Bus (USB), etc.). An electric grid device E may be, for example, an electric utility meter, a transformer, a light (e.g., a street light), an electric grid control device, an electric grid protection device, a recloser, a line sensor, a weather sensor, an Advanced Metering infrastructure (AMI) device, an analog or digital sensor connected to an electric utility asset, an electric generator, an electric turbine, an electric boiler, an electric vehicle, a home appliance, a battery storage device, a capacitor device, a solar power device, a smart generation device, an intelligent switching device, an emission monitoring device, or a voltage regulator.

Moreover, one or more of the communication nodes C may communicate with the head end system H of the electric utility data center 130 via the communication network 115. The communication network 115 may include one or more wireless or wired communication networks, such as a local area network (e.g., Ethernet or WiFi) or a Wide Area Network (e.g., a cellular network, Ethernet, or a fiber (such as fiber-optic) network).

A distribution transformer DT may control a voltage level of power that is transmitted to the premise energy router PER. In particular, the distribution transformer DT serves the customer premise 120 and may be the closest transformer of the electric grid 100 to the customer premise 120. The distribution transformer DT may be underground, mounted on a concrete pad, mounted on a utility pole, or otherwise fixed at a location that is upstream and spaced apart from the premise energy router PER. A communication node C may be adjacent (e.g., attached to) the distribution transformer DT and may communicate with the premise energy router PER via the communication network 115. Alternatively, functionality of the communication node C may be integrated with the distribution transformer DT.

By exchanging information with the distribution transformer DT and/or another transformer that is upstream from the premise energy router PER, the premise energy router PER and the transformer(s) can compare/match characteristics to improve power delivery and security. For example, the exchange of information may allow transformers to detect theft of the premise energy router PER and/or to monitor power phase data of the premise energy router PER.

A single distribution transformer DT may provide power to one or more customers in a given area. For example, in an urban area, a plurality of homes may be fed off of a single distribution transformer DT. Rural distribution, on the other hand, may use one distribution transformer DT per customer. Moreover, a large commercial or industrial complex may rely on multiple distribution transformers DT.

A distribution transformer DT has a low voltage secondary (e.g., output) side that distributes power to one or more customers. For example, in the United States, the low voltage secondary side of the distribution transformer DT may be configured for a 240/120-Volt system, and three wires (including one neutral wire) may be fed from the low voltage secondary side to the premise energy router PER.

In some embodiments, the premise energy router PER may provide peer-to-peer communications with a communication node C. For example, a communication node C may be integrated inside the premise energy router PER and may provide peer-to-peer communications with a communication node C that is inside the customer premise 120, and/or with a communication node C that is upstream from the premise energy router PER.

Figure 1B:
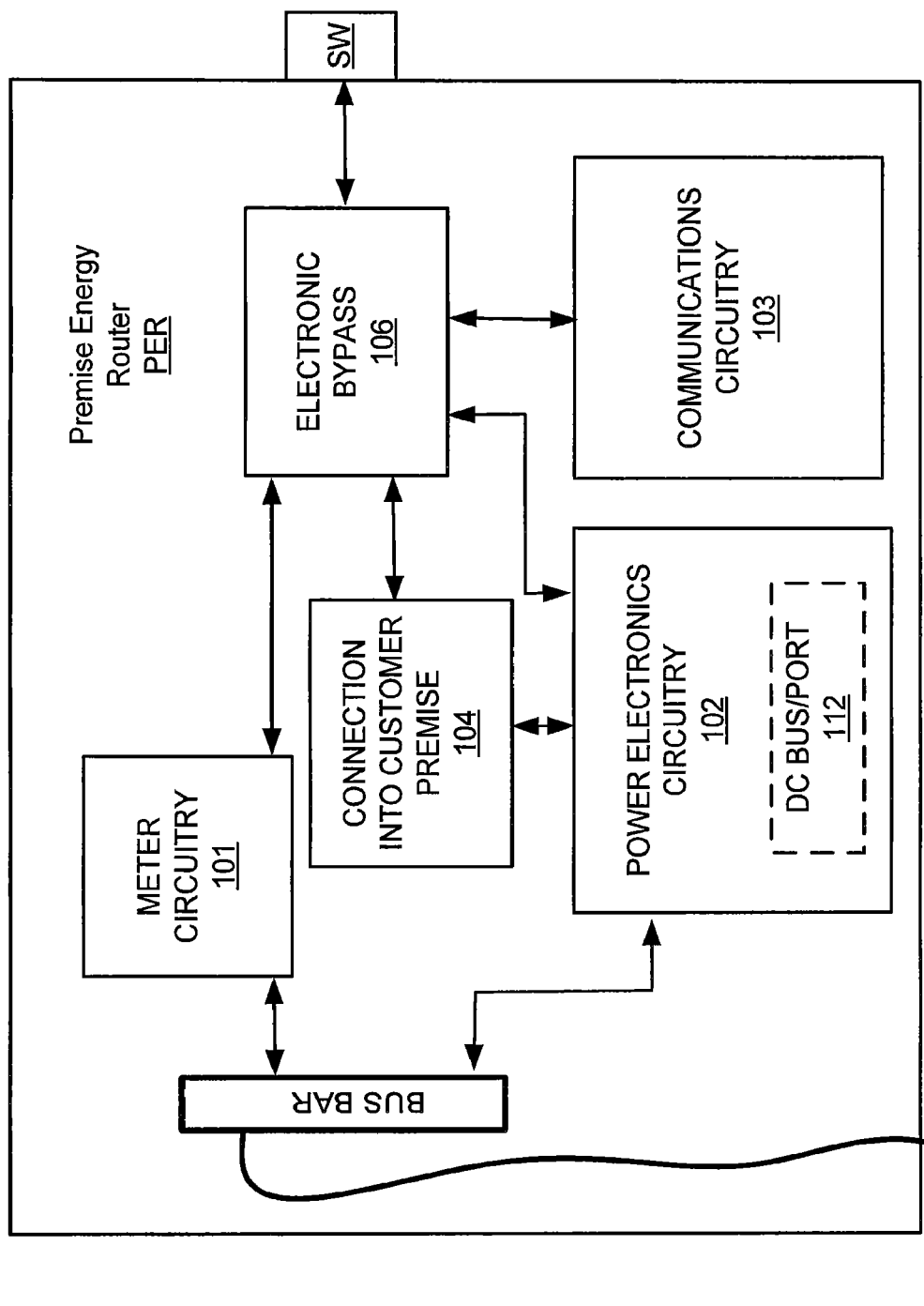
FIG. 1B is a block diagram of the premise energy router of FIG. 1A, according to various embodiments.

Referring now to FIG. 1B, a block diagram is provided of the premise energy router PER of FIG. 1A, according to various embodiments. A low voltage secondary service connection 107 of the distribution transformer DT is input to the premise energy router PER. Although the low voltage secondary service connection 107 is illustrated as a single wire for convenience, the inventive entity appreciates that three wires (including one neutral wire) may be used. In some embodiments, the low voltage secondary service connection 107 may be configured for a 240/120-Volt system, and may be input to electric utility meter circuitry 101 of the premise energy router PER. Moreover, in some embodiments, the customer premise 120 may be a commercial or industrial customer premise, and the low voltage secondary service connection 107 may use a higher voltage than 240 Volts (e.g., 277/480 Volts, for commercial/industrial applications). Accordingly, although the premise energy router PER may be a single-phase device for residential applications, the inventive entity appreciates that the premise energy router PER may optionally be used at higher voltages than 120/240 Volts for three-phase applications.

The electric utility meter circuitry 101 of the premise energy router PER includes hardware and/or software configured to perform the functionality of an electric utility meter. Accordingly, the premise energy router PER may replace an electric utility meter. As an example, the customer premise 120 may be a house of a customer, and the premise energy router PER may be mounted on the side of the house to replace an electric utility meter that had been mounted on the side of the house. The electric utility meter circuitry 101 of the premise energy router PER may thus be configured to measure electricity usage (e.g., to measure Alternating Current (AC) and/or Direct Current (DC) usage in kilowatt-hours (kWh)) by the customer at the customer premise 120. In particular, the usage measured may be usage of electricity that is supplied by a specific electric utility (e.g., the electric utility that owns the premise energy router PER) to the customer premise 120.

As the premise energy router PER is not a customer-owned device, it may be separate from a breaker box/load center and may provide more access/control to the electric utility that owns it than would a customer-owned device. In some embodiments, however, the premise energy router PER may optionally be used as a circuit breaker. Moreover, the premise energy router PER, which may be on the outside of a customer's home, may be separate from coaxial lines to the home. Additionally or alternatively, the premise energy router PER may be used as a photovoltaic (PV) inverter and/or a battery charger, and may thus replace an existing PV inverter or battery charger at the customer premise 120. In some embodiments, when the premise energy router PER is operating in an inverter mode for PVs, a user may change the mode of operation (e.g., among modes such as maximum generation limit function, fixed power factor, intelligent Volt-VAR function, Volt-Watt function, frequency-Watt function, etc.).

Referring still to FIG. 1B, the premise energy router PER includes power electronics circuitry 102 and communications circuitry 103. For example, the power electronics circuitry 102 may use 120/240 Volts provided from the distribution transformer DT by the low voltage secondary service connection 107. In particular, the power electronics circuitry 102 may be low voltage power electronics circuitry that uses 600 Volts or lower, including 120/240 Volts (as well as 208, 277, 480, or 600 Volts, for example). The inventive entity appreciates that the voltage regulated may be AC and/or DC. Moreover, in some embodiments, the electric utility meter circuitry 101 may be referred to as meter metrology, and the electric utility meter circuitry 101 and/or the power electronics circuitry 102 may be configured to measure phasor measurement units and/or voltage levels, to perform waveform pattern recognition, to monitor AC and DC load behavior, to perform condition-based maintenance and risk assessment of assets, and/or to provide time-synchronization functionality. For example, the electric utility meter circuitry 101 and/or the power electronics circuitry 102 may be configured to provide a synchrophasor that measures high order harmonics, provides a clean waveform, and/or re-synchronizes to an AC line. Additionally or alternatively, the power electronics circuitry 102 may be configured to regulate gain, power factor, voltage harmonic levels, and current harmonic levels, and/or to provide a DC power source. For example, the power electronics circuitry 102 may be configured to cancel current and voltage harmonics, and/or to balance phases.

In one example, the power electronics circuitry 102 may be configured to regulate a voltage level of 600 Volts or lower that is provided to the customer premise 120 via a connection 104. For embodiments in which the customer premise 120 is a home of the customer, the load at the connection 104 may be between 0 Volt-Amperes and 15,000 Volt-Amperes. Accordingly, the electric utility meter circuitry 101 may, in some embodiments, be configured to operate with a load from the customer premise 120 of between 0 Volt-Amperes and 15,000 Volt-Amperes. In other words, the power rating for the premise energy router PER may range from 0 Volt-Amperes to 15,000 Volt-Amperes. In some higher-power embodiments (e.g., three-phase applications), however, the range may extend above 15,000 Volt-Amperes. Also, the load current may be sinusoidal, 60 Hertz. In general, in comparison with the premise energy router PER, the substation 140 and the distribution transformer DT may handle much larger loads (e.g., 50,000 Volt-Amperes or higher).

Moreover, in some embodiments, the power electronics circuitry 102 may include a DC bus 112, which may also be referred to as a DC port. The DC bus 112 may be configured to provide a DC power source to the customer premise 120. For example, the DC bus 112 may be a 400-Volt DC bus. As another example, the DC bus 112 may be a 1,000-Volt DC bus. The inventive entity appreciates, however, that the DC bus 112 may provide a DC voltage output anywhere in the range of 5-1,000 Volts, or even above 1,000 Volts. In some embodiments, the power electronics circuitry 102 may include power output circuitry connected to the DC bus 112 and configured to convert a DC output of a photovoltaic (PV) solar panel into a utility frequency Alternating Current (AC) that can be fed into a commercial electrical grid (e.g., the electric grid 100) or used by a local, off-grid electrical network. The inventive entity appreciates that the DC bus 112 may optionally provide a plurality of DC ports (e.g., a plurality of DC ports providing different DC voltage levels). In other words, although FIG. 1B illustrates one DC bus 112, a plurality of DC buses 112 may optionally be included in the premise energy router PER. Moreover, the inventive entity appreciates that the DC bus 112 may include a plurality of stages, including an AC/DC stage, a DC/DC stage, and/or a DC/AC stage.

Additionally or alternatively, the power electronics circuitry 102 may be configured to convert AC power received from the low voltage secondary service connection 107 into DC power and to provide the DC power to one or more DC devices D via the DC bus 112. In some embodiments, the power electronics circuitry 102 may include both (i) AC-to-DC inverter circuitry (e.g., for converting AC into DC and providing DC from the DC bus 112 to a DC load) and (ii) DC-to-AC inverter circuitry (e.g., for converting DC from a solar device or a battery storage into AC). Moreover, in some embodiments, the power electronics circuitry 102 of the premise energy router PER may include a DC-to-DC converter (or a plurality of DC-to-DC converters) that reduces the 400 Volts to a lower DC voltage level that can be provided into the customer's home. The DC-to-DC converter may have level-shift capability and/or may be a buck-boost converter. Additionally or alternatively, inverter circuitry of the power electronics circuitry 102 may be configured to provide voltage and/or current source modes, and/or to provide either an isolated power supply or a non-isolated power supply.

The premise energy router PER may also include an electronic bypass 106 that bypasses the power electronics circuitry 102 and the communications circuitry 103. Accordingly, the premise energy router PER may use the electronic bypass 106 to operate the meter circuitry 101 without operating the power electronics circuitry 102 and the communications circuitry 103. Moreover, the premise energy router PER may optionally include a manual switch SW (e.g., on an external surface thereof) that bypasses the power electronics circuitry 102 and the communications circuitry 103. The premise energy router PER may include an external visual indicator, such as a display screen and/or an LED, to indicate that a bypass operation is occurring.

The electronic bypass 106 and/or manual switch SW help to reduce the impact to a customer of a problem with the power electronics circuitry 102 and/or the communications circuitry 103. For example, the power electronics circuitry 102 may sense an open neutral situation (or any other power anomaly/error) and responsively trigger a bypass and provide communications upstream to notify the electric utility of the open neutral situation. In some embodiments, the bypass may keep the customer from losing power. Moreover, in some embodiments, the electronic bypass 106 may be integrated within the power electronics circuitry 102, and/or a remote disconnect switch may be provided within the meter circuitry 101. Similarly, the communications circuitry 103 and/or the meter circuitry 101 may be integrated within the power electronics circuitry 102.

Figure 1C:
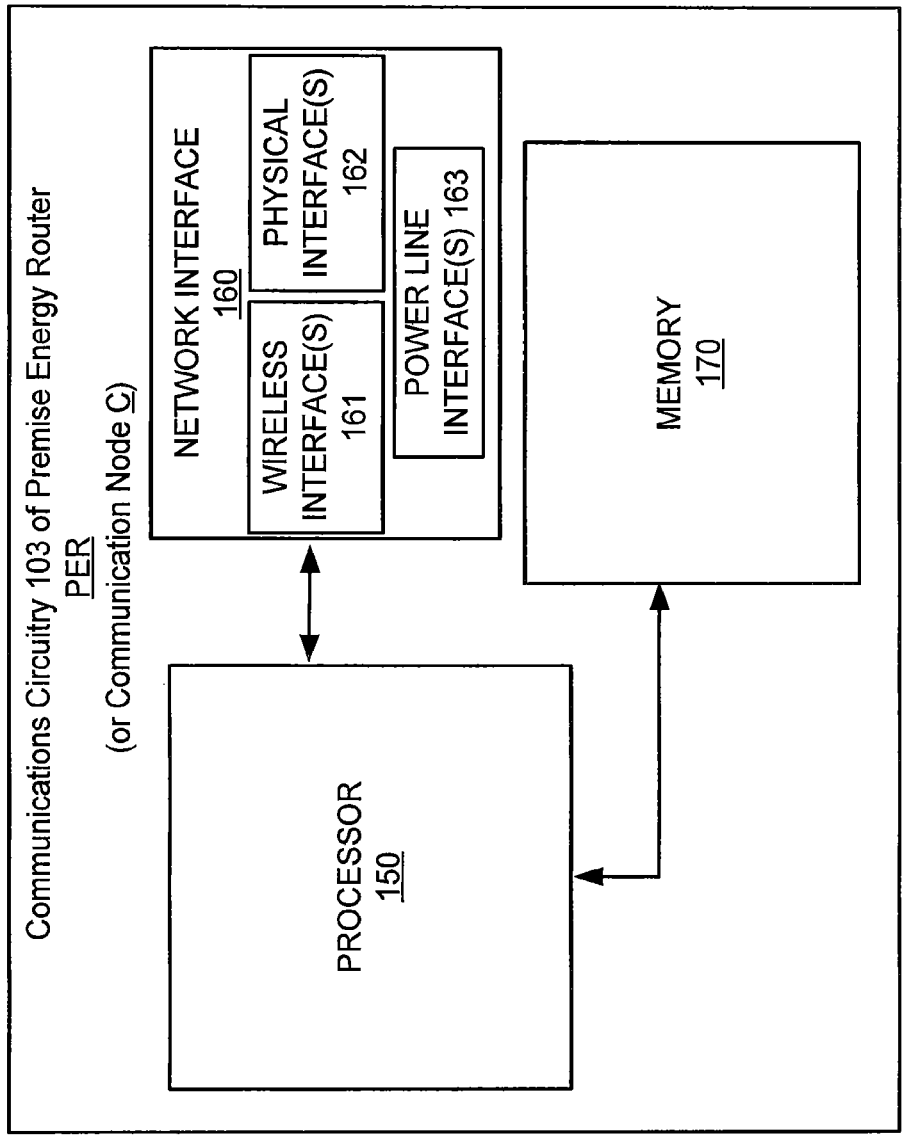
FIG. 1C is a block diagram of a communication node (or of communications circuitry of the premise energy router) of FIG. 1A, according to various embodiments.

Referring now to FIG. 1C, a block diagram is provided of the communications circuitry 103 of the premise energy router PER of FIGS. 1A and 1B (or of a communication node C of FIG. 1A), according to various embodiments. The communications circuitry 103 (or the communication node C) may include a processor 150, a network interface 160, and a memory 170. The processor 150 may be coupled to the network interface 160. The processor 150 may be configured to communicate with devices at the customer premise 120, electric grid devices E, communication nodes C, the substation 140, and/or the electric utility data center 130 via the network interface 160.

For example, the network interface 160 may include one or more wireless interfaces 161 (e.g., 3G/LTE, other cellular, WiFi, Global Positioning System (GPS) interfaces, etc.) and one or more physical interfaces 162 (e.g., Ethernet, serial, USB interfaces, etc.). Moreover, the network interface 160 may optionally include one or more power line interfaces 163 (e.g., Low Voltage (LV) or Mid Voltage (MV) PLC).

Accordingly, the premise energy router PER may, in some embodiments, have multiple integrated communications options. For example, the premise energy router PER may provide PLC, WiFi, Zigbee, Z-wave communications, or other communications via the network interface 160 into the customer premise 120 (e.g., a customer's home), and may provide cellular communications or other communications to the electric grid 100. As an example, the premise energy router PER may communicate with smart appliances and demand response devices (e.g., devices that reduce load by turning off appliances, air conditioning, etc.) at the customer premise 120. By sharing data from inside the customer premise 120 with the premise energy router PER, the customer can improve the efficiency of power delivery by the premise energy router. In some embodiments, the premise energy router PER may optionally be used to control smart devices at the customer premise 120, and may thus reduce the total energy consumption at the customer premise 120.

Moreover, the premise energy router PER may have a modular design that allows the premise energy router PER to use a variety of communications technologies, and to therefore not be limited exclusively to one communications technology, such as PLC communications. The premise energy router PER may be referred to as having a modular design because the meter circuitry 101, the power electronics circuitry 102, and/or the communications circuitry 103 may be integrated circuits provided on respective plug-and-play cards that can be easily added to and removed from (e.g., removed and replaced with a new and/or different card providing improved/different functionality). As an example, the communications circuitry 103 may include a PLC card that may be replaced with or supplemented by a card that provides WiFi communications. Various other types of cards may also be used, including voltage inverter cards and rectifier cards, among other types of cards that are modular/interchangeable from one premise energy router PER to the next.

Referring still to FIG. 1C, the memory 170 may be coupled to the processor 150. The memory 170 may also store instructions/algorithms used by the processor 150. For example, the memory 170 of the premise energy router PER may include one or more algorithms that improve/optimize power flow to the customer premise 120. Using such algorithms, the premise energy router PER may maintain a data log/history for the meter circuitry 101, the power electronics circuitry 102, and/or the communications circuitry 103. Moreover, the premise energy router PER may use such algorithms to enable an override of predetermined set points, such as to enable an override of a 120/240 Volt set point to thereby reduce the output voltage below 120/240 Volts. Additionally or alternatively, the premise energy router PER may use such algorithms to provide notification of power/communications errors and notification of use of the bypass state.

The communications circuitry 103 (or the communication node C) may include core hardware components such as a power supply, 10 MHz or higher speed processor(s), and 1 Megabyte (MB) or more of RAM. Because a premise energy router PER includes integrated processor 150 and memory 170 capability, the premise energy router PER can move/adjust voltage levels, Volt-Amperes Reactive (VARs), etc. The integrated processor 150 and memory 170 capability may be referred to as an integrated distributed intelligence platform.

The communications circuitry 103 (or the communication node C) may include core applications, such as CPU/memory/OS management applications, port/device drivers, router/Internet Protocol (IP) services, network management services, basic protocol support, SCADA, custom Application Programming Interface (API)/applications, and device security services. Moreover, the communications circuitry 103 (or the communication node C) may include virtual applications, such as a virtual machine (e.g., a Java Virtual Machine), message bus(es), message broker(s), protocol adapters, mini-SCADA, open-standards API, and third-party applications (e.g., security/analytics applications). For example, the communications circuitry 103 may support Distributed Network Protocol (DNP) (e.g., DNP 3.0), Modbus, and Message Queue Telemetry Transport (MQTT) protocols. The core applications may use such software as C++/Linux, and the virtual applications may use such software as Java/Linux.

Figure 1D:
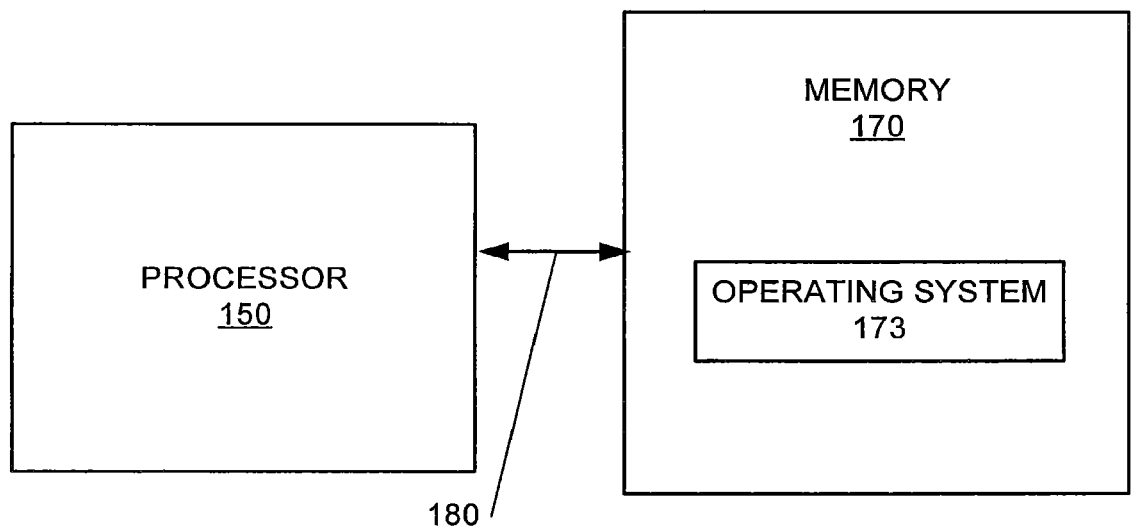
FIG. 1D is a block diagram that illustrates details of an example processor and memory that may be used in accordance with various embodiments.

Referring now to FIG. 1D, a block diagram is provided that illustrates details of an example processor 150 and memory 170 of the communications circuitry 103 (or of a communication node C) that may be used in accordance with various embodiments. The processor 150 communicates with the memory 170 via an address/data bus 180. The processor 150 may be, for example, a commercially available or custom microprocessor. Moreover, the processor 150 may include multiple processors. The memory 170 is representative of the overall hierarchy of memory devices containing the software and data used to implement various functions of the communications circuitry 103 or other circuitry of the premise energy router PER (or of a communication node C) as described herein. The memory 170 may include, but is not limited to, the following types of devices: cache, ROM, PROM, EPROM, EEPROM, flash, Static RAM (SRAM), and Dynamic RAM (DRAM).

As shown in FIG. 1D, the memory 170 may hold various categories of software and data, such as an operating system 173. The operating system 173 controls operations of the communications circuitry 103 or other circuitry of the premise energy router PER (or of a communication node C). In particular, the operating system 173 may manage the resources of the communications circuitry 103 or other circuitry of the premise energy router PER (or of a communication node C) and may coordinate execution of various programs by the processor 150.

Referring now to FIGS. 2A-2E, flowcharts are provided illustrating operations of the premise energy router PER of FIG. 1A, according to various embodiments. In particular, referring to FIG. 2A, operations of an apparatus (e.g., the premise energy router PER) connected between a utility secondary service 107 of an electric utility and a wiring connection 104 of a customer at a premise 120 of the customer are provided. For example, operations of the premise energy router PER include measuring (Block 210), using the electric utility meter circuitry 101, usage of electricity supplied by the electric utility to the premise 120 of the customer of the electric utility. As an example, the operations of Block 210 may include performing measurements in kilowatt hours or in other units of measurement of energy used. Moreover, the inventive entity appreciates that the power electronics circuitry 102 may be unmetered so that it does not affect a customer's energy consumption. For example, referring again to FIG. 1B, the premise energy router PER may include a bus bar that is independently connected between the utility secondary service 107 of the electric utility and each of the electric utility meter circuitry 101 and the power electronics circuitry 102.

Figure 2A:
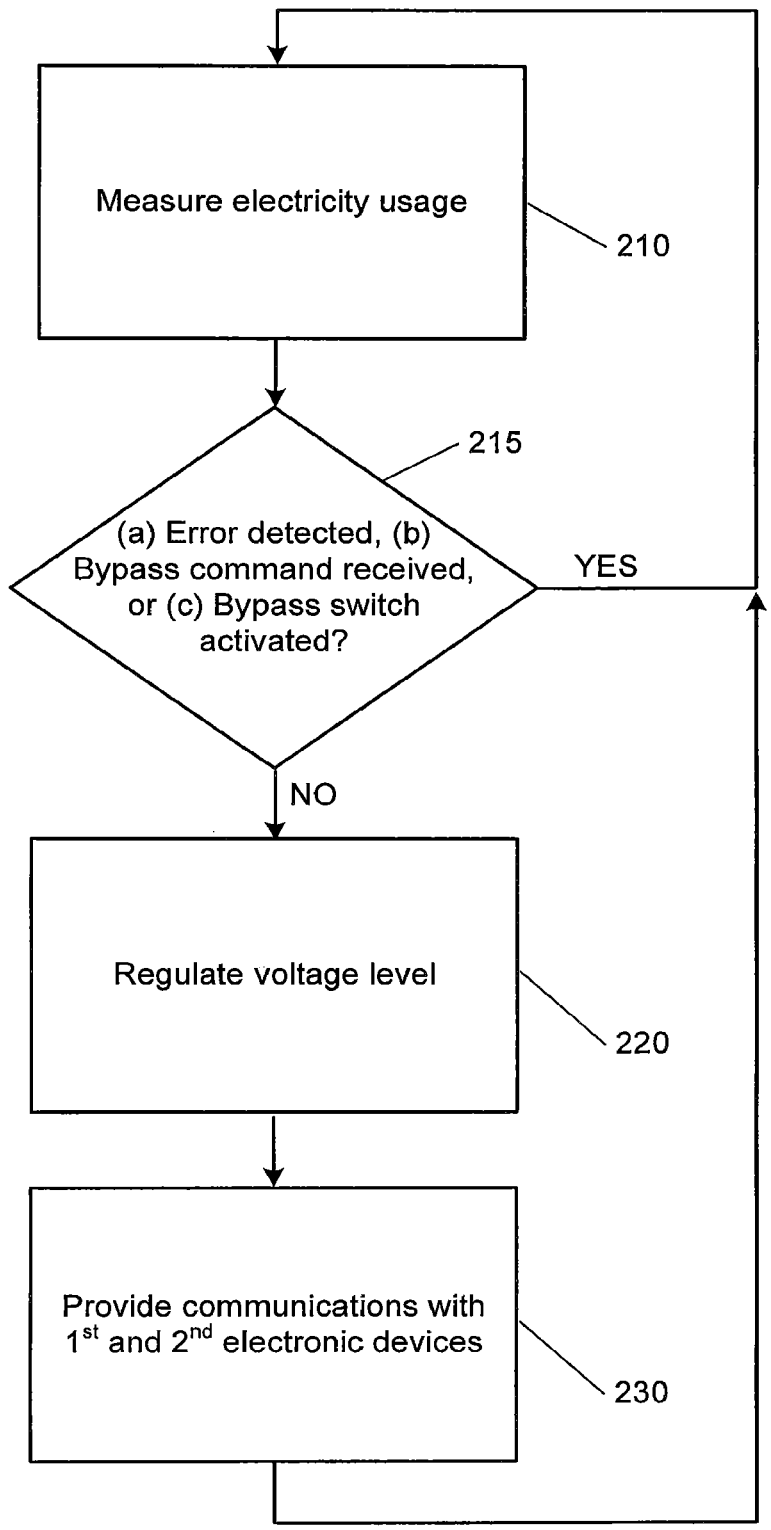
FIGS. 2A-2E are flowcharts illustrating operations of the premise energy router of FIG. 1A, according to various embodiments.

Referring still to FIG. 2A, operations of the premise energy router PER include regulating (Block 220), using the power electronics circuitry 102, a voltage level supplied to the premise 120 of the customer. Moreover, operations of the premise energy router PER include providing (Block 230) communications, using the communications circuitry 103, with a first electronic device of the customer that is at the premise 120 of the customer and with a second electronic device that is upstream from the premise energy router PER. For example, the second electronic device may be spaced apart from the premise 120 of the customer and (a) connected to the electric grid 100 or (b) adjacent an electric grid device E or transformer T/DT that is connected to the electric grid 100.

The first electronic device of the customer may be an appliance A or a DC device D that is at (e.g., on or within) the customer premise 120 and that is configured to communicate with the premise energy router PER via the communication network 105. Alternatively, the first electronic device of the customer may be a communication node C that corresponds to (and is adjacent/attached to) the appliance A or device D, or may be any other device that is configured to communicate (e.g., using the circuitry illustrated in FIG. 1C) with the premise energy router PER via the communication network 105. Moreover, the second electronic device may be (a) the distribution transformer DT, (b) the substation 140, (c) an electric grid device E, (d) the electric utility data center 130, or (e) a communication node C corresponding to any one of (a)-(d).

The communications of the premise energy router PER with the first and second electronic devices may include the same data and/or different data. For example, the premise energy router PER could send the same data to the electric grid 100 and to the customer. Because the premise energy router PER may be communications agnostic, it may be able communicate with a device inside the customer premise 120 and/or a device upstream from the premise energy router PER and the customer premise 120 and on the electric grid 100, using the same or different communications technologies, and share information with each device as required. All communications may be secured through any of various telecommunications mediums.

As illustrated in Block 215, the operations of Blocks 220 and 230 may, in some embodiments, be conditioned upon the absence of detecting an error (e.g., any type of power or communications anomaly), the absence of receiving an electronic bypass command (e.g., at the electronic bypass circuitry 106), and/or the absence of activation of the manual bypass switch SW of the premise energy router PER. Accordingly, operations of measuring (Block 210) the usage of electricity may include measuring the usage of electricity while bypassing use of the power electronics circuitry 102 and/or the communications circuitry 103, in response to detecting an error, receiving a bypass command via the communications circuitry 103, and/or activation of the manual bypass switch SW. If an error is detected, then the premise energy router PER may use its memory 170 to log the error and its network interface 160 to communicate the error into the customer premise 120 and/or upstream to the electric grid 100.

Moreover, the inventive entity appreciates that the order of Blocks 210-230 may be rearranged. For example, the premise energy router PER may provide (Block 230) communications before regulating (Block 220) the voltage level. As an example, if the premise energy router PER is experiencing a high load, then the premise energy router PER may send a notification of the high load upstream and may receive a remote signal/command (that is triggered by the notification) to reduce the voltage output. In response to the remote signal/command, the premise energy router PER may reduce the voltage, and thereby reduce its load.

Accordingly, adjustments (e.g., regulation) may be performed/determined remotely and communicated via a communications protocol used by the premise energy router PER. For example, an adjustment may be determined/commanded by a localized communication node C in the field or at a centralized operations center, such as the utility data center 130 including the head end H. As an example, a user at the utility data center 130 may use a secure Web interface to conduct/command the adjustment. Additionally or alternatively to voltage regulation, adjustments may include power factor adjustments such as increasing the power factor.

Figure 2B:
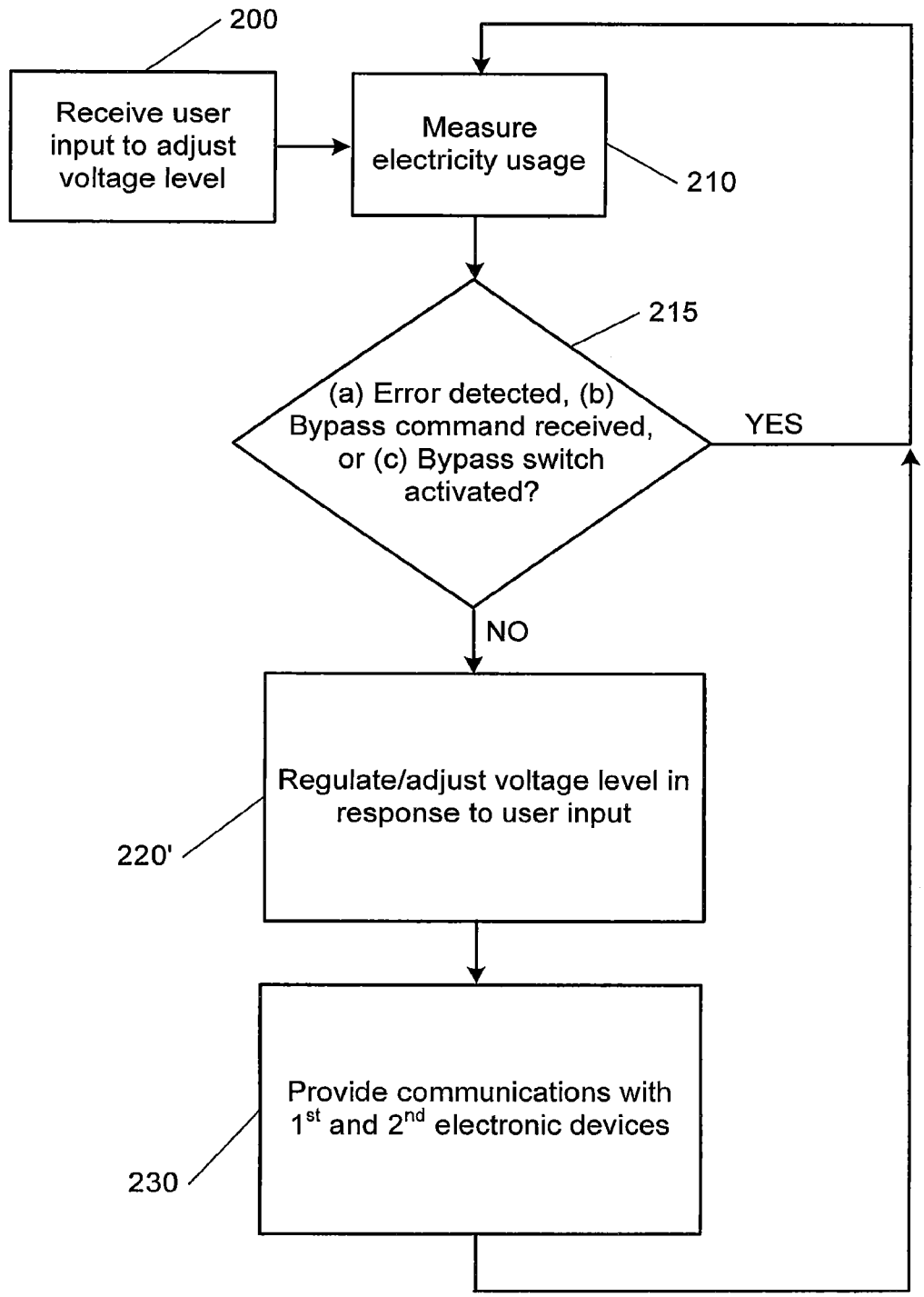

Referring to FIG. 2B, operations of the premise energy router PER may include receiving (Block 200) a user input providing a command to adjust the voltage level supplied to the premise 120 of the customer. Moreover, operations of regulating (Block 220) the voltage level may include adjusting (Block 220') the voltage level in response to the user input. For example, a user (e.g., the customer or an electric utility) may remotely enter the user input into an electronic device and then transmit the user input to the premise energy router PER via the communication network 105 or the communication network 115. As an example, the user or the utility may remotely provide an input to increase or decrease the voltage level. In some embodiments, the user input may specify a particular voltage level (or a particular voltage range) selected by the user.

Figure 2C:
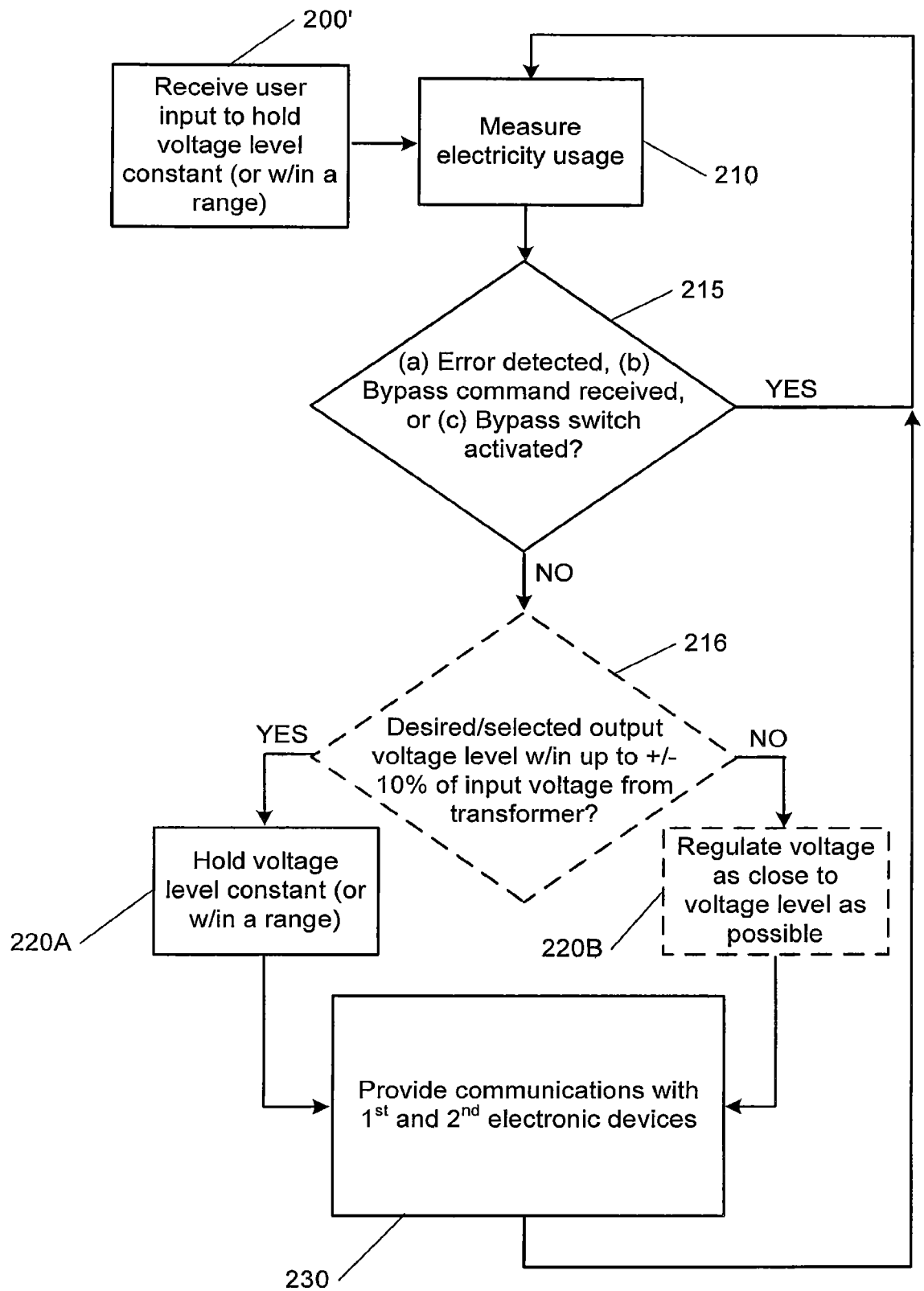

Referring to FIG. 2C, operations of the premise energy router PER may include receiving (Block 200') a user input providing a command to hold constant the voltage level supplied to the premise 120 of the customer. Alternatively, the user input may provide a command to hold the voltage level within a desired/predetermined range of voltages. For example, the user may provide a command to hold the voltage level anywhere within the limits allowed by regulatory requirements (e.g., anywhere within 114-126 Volts) or anywhere within a user-specified voltage range (e.g., 117-122 Volts, etc.) that is narrower than the range allowed by regulatory requirements. The user input of Block 200' may be received in the same manner as described with respect to the user input of Block 200, or may be received in a similar manner.

Moreover, operations of regulating (Block 220, FIG. 2A) the voltage level may include holding (Block 220A) the output voltage level of the premise energy router PER constant as long as the desired/selected (e.g., user-selected) voltage level is within a predetermined percentage range of the input voltage level supplied from the distribution transformer DT to the premise energy router PER. For example, if the input voltage coming into the premise energy router PER from a utility transformer (e.g., the distribution transformer DT) is 125 Volts, then the premise energy router PER can adjust that input voltage by up to ten percent (i.e., up to +/−10%) of the value of that input voltage. Accordingly, the premise energy router PER can take that input voltage of 125 Volts and increase it by up to 10%, thus providing an output voltage as high as 137.5 Volts, or decrease the input voltage by up to −10%, thus providing an output voltage as low as 112.5 Volts. As an alternative to holding the output voltage level constant, operations of regulating (Block 220, FIG. 2A) the voltage level may include holding (Block 220A) the output voltage level of the premise energy router PER within a desired/predetermined voltage range (e.g., within 114-126 Volts, 117-122 Volts, etc.), in response to a command to hold the output voltage level within the voltage range.

In some embodiments, however, the electric utility providing the output voltage, may be bound to keep the output voltage within tariff limits or other regulatory requirements, which can vary by state. In North Carolina, for example, the electric utility may be limited to +/−5% adjustments (instead of the wider +/−10% range that the premise energy router PER may be capable of) for residential electric utility services. As an example, if the input voltage to the premise energy router PER is 120 Volts, then the electric utility may be limited in North Carolina to 126 Volts and 114 Volts as upper and lower output voltage limits, respectively.

Referring still to FIG. 2C, Block 216 illustrates that the premise energy router PER may be capable of voltage adjustments of up to +/−10%. If the premise energy router PER is allowed (e.g., by state regulatory requirements) to use +/−5% of its full +/−10% range, if the distribution transformer DT supplies 120 Volts to the premise energy router PER, and if the user provides a user input to hold the voltage level constant at 115 Volts, then the power electronics circuitry 102 of the premise energy router PER will hold (Block 220A) the voltage level constant at 115 Volts because 115 Volts is within +/−5% of 120 Volts.

If, on the other hand, the distribution transformer DT supplies 120 Volts to the premise energy router PER, and if the user provides a user input to hold the voltage level constant at 105 Volts, then the power electronics circuitry 102 of the premise energy router PER will regulate (Block 220B) the voltage level to be as close to 105 Volts as possible. The power electronics circuitry 102 (FIG. 1B), however, may not be able to hold the voltage level at 105 Volts because 105 Volts is more than +/−10% (and significantly more than +/−5%) of 120 Volts.

In some embodiments, the user input provided in Block 200' may specify a particular/discrete output voltage (e.g., 105 Volts, 115 Volts, or another value), which may be different from the input voltage level that is currently being supplied from the distribution transformer DT to the premise energy router PER, to hold constant. Alternatively, the user input may request to hold the output voltage constant as the current input voltage level that is being supplied to the premise energy router PER, without requiring the user to change the voltage level or to otherwise specify a value of the voltage level. Moreover, the illustration in Blocks 200', 216, and 220A of FIG. 2C of holding the output voltage level constant as long as the output voltage level desired/selected by the user is within up to +/−10% of the incoming voltage from the distribution transformer DT includes any circumstance in which the percentage range is equal to or lower than 10%, including lower percentage ranges, such as 5%, that may be required to comply with regulatory requirements. For example, in some embodiments, to comply with regulatory requirements, the power electronics circuitry 102 may hold the output voltage level supplied by the premise energy router PER constant as long as the output voltage level desired/selected by the user is within +/−5% of the incoming voltage from the distribution transformer DT. The inventive entity appreciates, however, that the operations of Blocks 216 and 220B may optionally be omitted when the user input is a command to hold the voltage level within a voltage range (rather than to hold the voltage level constant).

Accordingly, the premise energy router PER can operate autonomously/dynamically in that it can use the power electronics circuitry 102 (FIG. 1B) to maintain an exact voltage level as long as the incoming voltage is within a certain percentage range of the voltage setting. Moreover, in some embodiments, the premise energy router PER can be controlled remotely (e.g., to reduce the voltage level, to hold it constant at the current level, or to hold it within a voltage range) via an individual user input/setting, and the premise energy router PER may control the voltage level without further user input beyond the individual user input/setting. When controlling the voltage level, the premise energy router PER can make decisions regarding the total load on the premise energy router PER rather than having to make multiple decisions for respective individual branches of the electric grid 100. By finely controlling the power to the customer premise 120, the premise energy router PER can reduce power quality disruptions, such as lights flickering in a customer's home when an air conditioning unit of the home turns on.

Figure 2D:
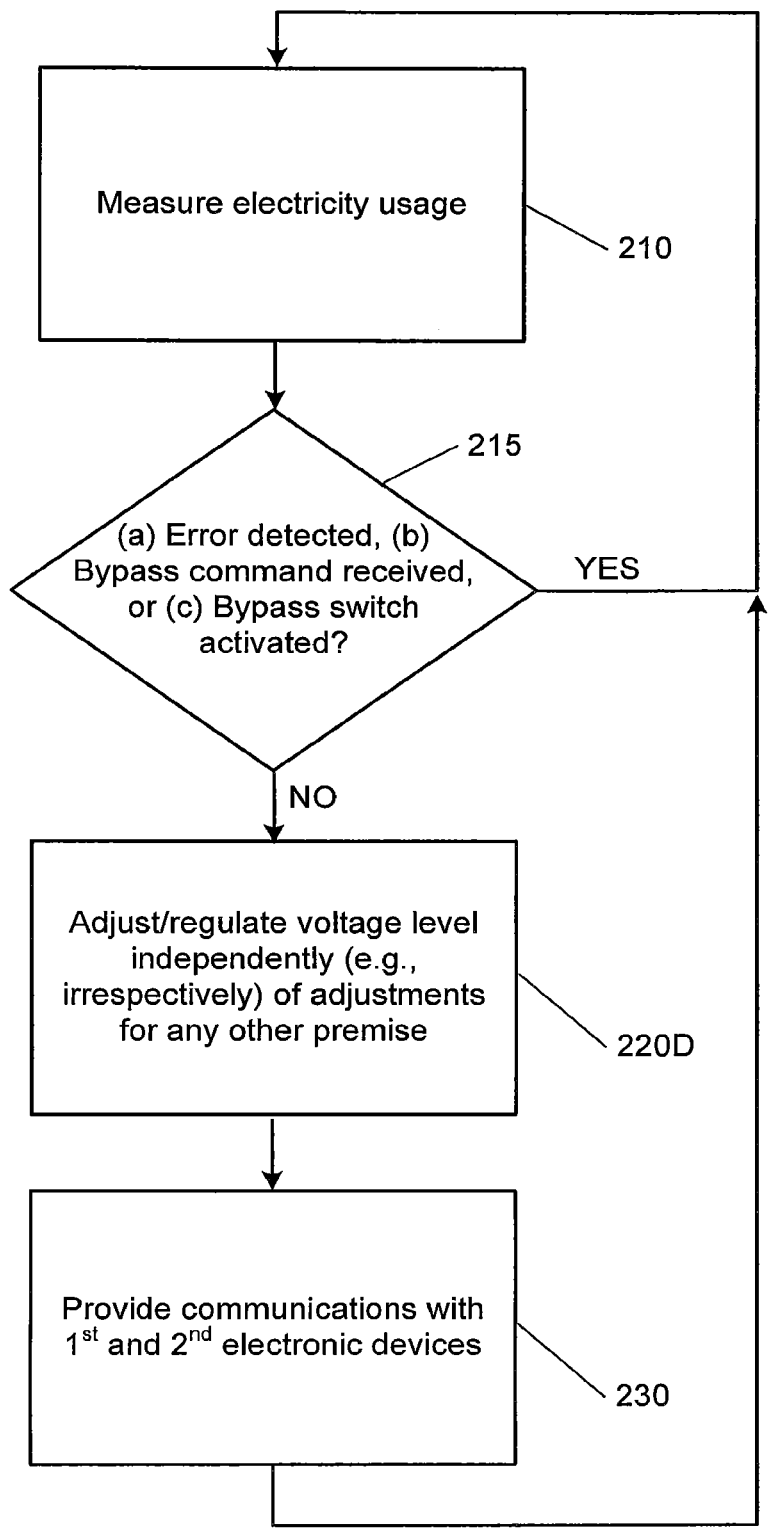

Referring to FIG. 2D, operations of regulating (Block 220, FIG. 2A) the voltage level may include adjusting (Block 220D) the voltage level supplied to the premise 120 of the customer independently of adjustments for any other premise of any other customer of the electric utility. In other words, adjusting the voltage level supplied the premise 120 of the customer will not adjust the voltage level supplied to any other premise of any other customer, nor will an adjustment to the voltage level supplied to any other premise of any other customer adjust the voltage level supplied to the premise 120 of the customer. Rather, the power electronics circuitry 102 (FIG. 1B) of the premise energy router PER is configured to supply a regulated/adjusted voltage level exclusively to the customer premise 120.

Additionally or alternatively, the power electronics circuitry 102 (FIG. 1B) may be configured to regulate Volt-Amperes Reactive (VARs) provided to the customer premise 120. For example, additionally or alternatively to adjusting (Block 220D) the voltage level independently of adjustments for any other premise, the power electronics circuitry 102 may be configured to regulate VARs provided to the customer premise 120 independently of regulating VARs for any other premise. In particular, the power electronics circuitry 102 may be configured to regulate the VARs that are output from the premise energy router PER within up to five percent (i.e., up to +/−5%) of a value input to the premise energy router PER, and to supply the regulated/adjusted VARs exclusively to the customer premise 120. In some embodiments, the VARs may be adjusted by up to +/−10% rather than +/−5%. Moreover, the inventive entity appreciates that the VARs and the voltage level may be independently (of each other) adjusted by the premise energy router PER. By inserting/regulating VARs, the premise energy router PER can improve the stability of power provided to the customer premise 120.

Figure 2E:
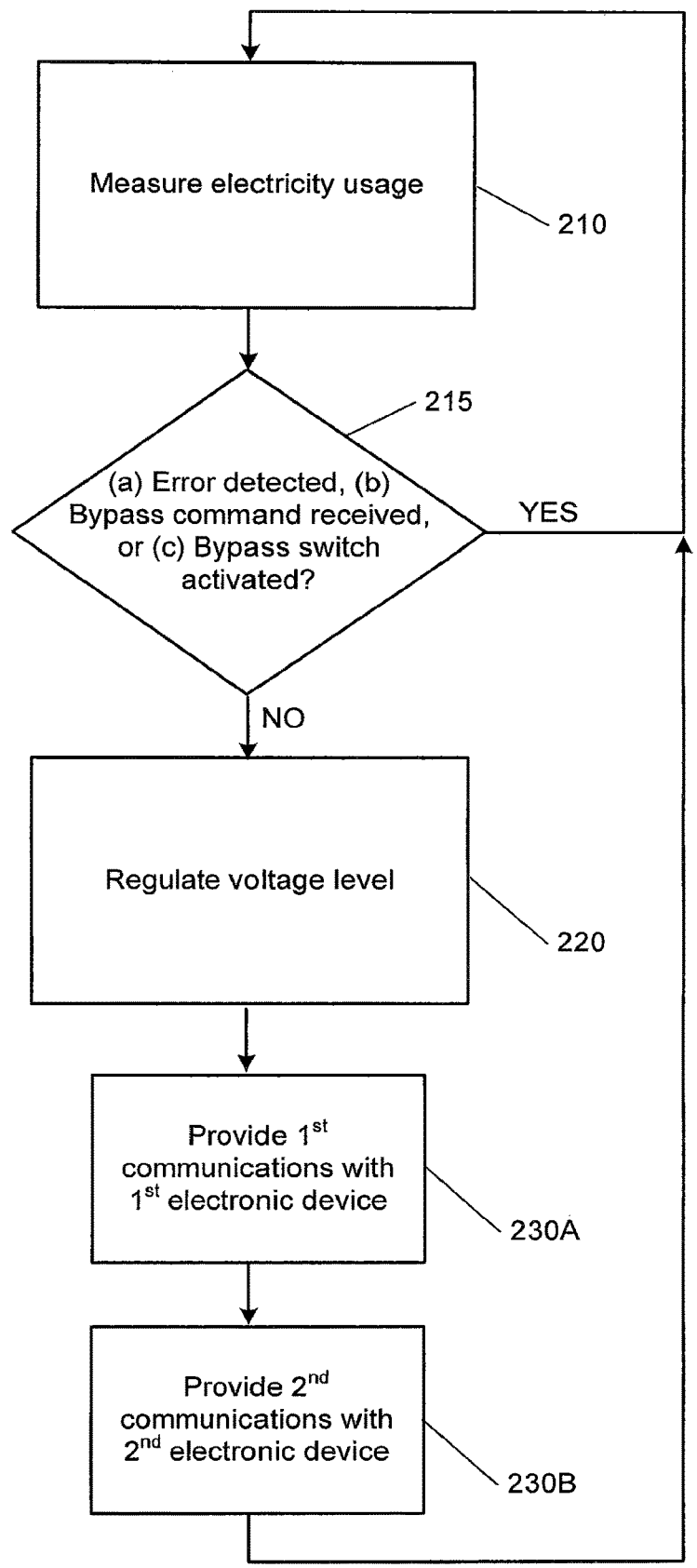

Referring to FIG. 2E, operations of providing (Block 230) communications may include providing (Block 230A) first communications, via a first communications interface, with the first electronic device of the customer. The operations may further include providing (Block 230B) second communications, via a second communications interface, with the second electronic device that is upstream from the premise energy router PER (e.g., that is spaced apart from the premise 120 of the customer and is (a) connected to the electric grid 100 or is (b) adjacent an electric grid device E or transformer T/DT that is connected to the electric grid 100). As one example, the premise energy router PER may provide WiFi or PLC communications with the first electronic device that is at the customer premise 120, and cellular communications with the second electronic device that is upstream from the premise energy router PER.

In some embodiments, a premise energy router PER illustrated in FIGS. 1A-1C may connect to an existing house secondary service (e.g., a wiring connection 104 of the customer) and an existing utility secondary service (e.g., the low voltage secondary service connection 107) on the house.

The premise energy router PER may replace an existing utility meter (and may optionally replace a meter base) on the house. For example, the premise energy router PER may be mountable on the side of the house, and may be no larger than twenty (20) inches wide, twelve (12) inches deep, and twenty-four (24) inches long (in terms of vertical height). The weight of the premise energy router PER may be forty (40) pounds or lighter (and, in some embodiments, thirty (30) pounds or lighter), such that one person can install the premise energy router PER.

Moreover, the premise energy router PER may enhance power quality for the customer and serve as a communications hub between the electric grid 100 and the house. The premise energy router PER may be configured for residential (e.g., one-phase, 120/240 Volts) applications. The premise energy router PER may not introduce any magnetic fields, as magnetic fields could interfere with telephone, cable, or other communications equipment, or with a transformer. The premise energy router PER also may not introduce harmonics. If the premise energy router PER does introduce harmonics, then it may also be configured to mitigate/eliminate the harmonics.

The present inventive entity appreciates that a premise energy router PER according to various embodiments described herein can provide power electronics that use 120/240 Volts and/or can provide a communications platform, at a customer's premise 120 rather than upstream from the customer's premise 120, thus enabling better utilization of upstream devices/systems for other tasks. For example, an individual premise energy router PER can provide communications both to inside a customer's home and upstream to an electric grid 100. As an example, a premise energy router PER can use operations illustrated in FIGS. 2A-2E to provide such power electronics and communications functionality. The power electronics and/or communications functionality of the premise energy router PER may improve analytics/monitoring of devices and appliances A inside the customer's home.

Moreover, the power electronics circuitry 102 of the premise energy router PER may provide a 400-Volt DC bus 112 that may provide a DC power source into the customer's home and/or receive 400-Volt DC inputs. For example, in some embodiments, the DC bus 112 may both (a) receive a 400-Volt DC input (e.g., from a solar device or a battery storage) and (b) provide a 400-Volt DC output to a DC load (e.g., an electric vehicle charging station). By receiving DC inputs, the DC bus 112 may accelerate the use of distributed energy resources (e.g., DC loads such as solar panels, wind energy devices, battery storage devices, electric vehicles, etc.) because the DC bus 112 can obviate the need for a separate inverter, thus saving customers money. Also, the premise energy router PER may follow such DC loads closely and may sustain a steady voltage level despite environmental factors such as a cloud moving over a solar generator.

Additionally or alternatively, the operations illustrated in FIGS. 2A-2E can use a premise energy router PER to set a voltage and/or VARs for a particular customer premise 120 independently of settings for other customer premises. Accordingly, the premise energy router PER can provide fine control/adjustments at the particular customer premise 120, rather than upstream coarse adjustments for a group of customer premises. As an example, a control/adjustment at a distribution line would affect a plurality of customers, whereas premise energy routers at respective customer premises enable fine controls/adjustments for a particular customer premise 120 that are independent of controls/adjustments for other customer premises. Such tighter/finer controls/adjustments of voltage and/or VARs may help to reduce power fluctuations. Moreover, active power insertion by the premise energy router PER may increase efficiency of the electric grid 100. For example, the premise energy router PER may dynamically insert reactive power (e.g., +/−5,000 VARs) and may achieve unity power factor.

The present inventive entity also appreciates that a premise energy router PER according to various embodiments herein may provide utility meter functionality. The premise energy router PER may therefore replace an existing utility meter at the location of the existing utility meter. For example, an existing utility meter may be removed, and the premise energy router PER may be installed at the location where the utility meter had been before it was removed. Also, because the premise energy router PER according to various embodiments herein can operate autonomously/dynamically, can reduce a voltage level input to a customer premise 120, and/or can communicate with smart devices within the customer premise 120, the premise energy router PER can conserve electrical energy. The inventive entity appreciates, however, that reducing a voltage level input to the customer premise 120 will not necessarily reduce energy consumption in every instance. Accordingly, the premise energy router PER may increase the voltage level in instances where reducing the voltage level would undesirably result in an energy consumption increase.

In the specification, various embodiments of the present inventive concepts have been disclosed and, although specific terms are employed, they are used in a generic and descriptive sense only and not for purposes of limitation. Those skilled in the art will readily appreciate that many modifications are possible for the disclosed embodiments without materially departing from the teachings and advantages of the present inventive concepts. The present inventive concepts are defined by the following claims, with equivalents of the claims to be included therein.

What is claimed is:

1. A premise energy router comprising:
electric utility meter circuitry in the premise energy router and configured to measure usage of electricity supplied by an electric utility to a premise of a customer of the electric utility;
power electronics circuitry in the premise energy router and configured to regulate a voltage level supplied to the premise of the customer; and
communications circuitry in the premise energy router and configured to provide communications with a first electronic device of the customer at the premise of the customer and to provide communications with a second electronic device that is upstream from the premise energy router,
wherein the premise energy router is no larger than twenty inches wide, twelve inches deep, and twenty-four inches long,
wherein a utility secondary service connection of the electric utility is input to the premise energy router, and
wherein the premise energy router is connected to a wiring connection of the customer at the premise of the customer.

2. The premise energy router of claim 1,
wherein the voltage level that the power electronics circuitry is configured to regulate comprises 120 Volts and/or 240 Volts, and
wherein the premise energy router is mountable on a side of the premise of the customer.

3. The premise energy router of claim 2, wherein the electric utility meter circuitry is configured to operate with a load from the premise of the customer between 0 Volt-Amperes and 15,000 Volt-Amperes.

4. The premise energy router of claim 1, wherein the power electronics circuitry comprises a Direct Current (DC) bus configured to interface with a DC load and/or a DC power source at the premise of the customer.

5. The premise energy router of claim 4,
wherein the power electronics circuitry comprises power inverter circuitry that is configured to convert DC power received from the DC power source via the DC bus into Alternating Current (AC) power, and
wherein the DC bus comprises a 400-Volt DC input port or higher.

6. The premise energy router of claim 4,
wherein the DC bus comprises a DC output port of a 400-Volt or higher DC power source that is configured to provide DC power to the DC load, and
wherein the power electronics circuitry comprises power inverter circuitry that is configured to convert Alternating Current (AC) power into DC power for the DC output port.

7. The premise energy router of claim 1, wherein the communications circuitry comprises:
a first communications interface configured to provide first communications with the first electronic device of the customer; and
a second communications interface configured to provide second communications with the second electronic device that is upstream from the premise energy router.

8. The premise energy router of claim 1,
wherein the power electronics circuitry is configured to adjust the voltage level by up to +/−10%,
wherein the premise energy router is spaced apart from a distribution transformer that serves the premise of the customer, and
wherein the power electronics circuitry is configured to automatically hold the voltage level constant as long as the voltage level is within up to +/−10% of an incoming voltage from the distribution transformer.

9. The premise energy router of claim 8, wherein the voltage level is derived from a user input that is provided to the premise energy router remotely via the communications circuitry.

10. The premise energy router of claim 1, further comprising bypass circuitry in the premise energy router and configured to bypass the power electronics circuitry and the communications circuitry, wherein the premise energy router is spaced apart from a circuit breaker box.

11. The premise energy router of claim 1, wherein the power electronics circuitry is configured to hold the voltage level within a predetermined voltage range.

12. The premise energy router of claim 1, further comprising a bus bar that is in the premise energy router and is connected to the electric utility meter circuitry and to the power electronics circuitry,
wherein the electric utility meter circuitry and the power electronics circuitry are downstream from the bus bar, and
wherein the bus bar is downstream from a distribution transformer that serves the premise of the customer.

13. The premise energy router of claim 1, wherein the electric utility meter circuitry, the power electronics circuitry, and/or the communications circuitry comprise integrated circuits on respective plug-and-play cards in the premise energy router.

14. A method of operating a premise energy router connected between a utility secondary service of an electric utility and a wiring connection of a customer at a premise of the customer, the method comprising:
measuring, using electric utility meter circuitry of the premise energy router connected between the utility secondary service of the electric utility and the wiring connection of the customer at the premise of the customer, usage of electricity supplied by the electric utility to the premise of the customer of the electric utility;
regulating, using power electronics circuitry of the premise energy router connected between the utility secondary service of the electric utility and the wiring connection of the customer at the premise of the customer, a voltage level supplied to the premise of the customer; and
providing communications, using communications circuitry of the premise energy router connected between the utility secondary service of the electric utility and the wiring connection of the customer at the premise of the customer, with a first electronic device of the customer that is at the premise of the customer and with a second electronic device that is upstream from the premise energy router connected between the utility secondary service of the electric utility and the wiring connection of the customer at the premise of the customer.

15. The method of claim 14, wherein providing the communications comprises:
providing first communications, via a first communications interface, with the first electronic device of the customer; and
providing second communications, via a second communications interface, with the second electronic device that is upstream from the premise energy router connected between the utility secondary service of the electric utility and the wiring connection of the customer at the premise of the customer.

16. The method of claim 14, further comprising:
receiving, via the communications circuitry, a user input providing a command to hold the voltage level constant,
wherein the power electronics circuitry is downstream from a distribution transformer that serves the premise of the customer,
wherein the distribution transformer is downstream from a substation of the electric utility, and
wherein regulating the voltage level comprises holding the voltage level constant as long as the voltage level is within up to +/−10% of an incoming voltage from the distribution transformer, in response to receiving the user input.

17. The method of claim 14, further comprising:
receiving, via the communications circuitry, a user input providing a command to hold the voltage level within a predetermined voltage range,
wherein the power electronics circuitry is downstream from a distribution transformer that serves the premise of the customer,
wherein the distribution transformer is downstream from a substation of the electric utility, and
wherein regulating the voltage level comprises holding the voltage level within the predetermined voltage range, in response to receiving the user input.

18. The method of claim 14, further comprising:
receiving, via the communications circuitry, a user input providing a command to adjust the voltage level,
wherein regulating the voltage level comprises adjusting the voltage level in response to the user input.

19. The method of claim 14, wherein measuring the usage of electricity comprises measuring the usage of electricity while bypassing use of the power electronics circuitry and/or the communications circuitry, in response to detecting an error, receiving a bypass command via the communications circuitry, and/or activation of a manual bypass switch of the premise energy router connected between the utility secondary service of the electric utility and the wiring connection of the customer at the premise of the customer.

20. The method of claim 14,
wherein the power electronics circuitry is downstream from a distribution transformer that serves the premise of the customer, and
wherein the distribution transformer is downstream from a substation of the electric utility.

21. A premise energy router comprising:
electric utility meter circuitry in the premise energy router and configured to measure usage of electricity supplied by an electric utility to a premise of a customer of the electric utility, wherein the electric utility meter circuitry is configured to operate with a load from the premise of the customer between 0 Volt-Amperes and 15,000 Volt-Amperes;
power electronics circuitry in the premise energy router and configured to regulate a voltage level supplied from a utility secondary service of the electric utility to the premise of the customer, wherein the voltage level that the power electronics circuitry is configured to regulate comprises 120 Volts and/or 240 Volts; and
communications circuitry in the premise energy router and configured to provide communications with a first electronic device of the customer at the premise of the customer and to provide communications with a second electronic device that is upstream from the premise energy router.

22. A system comprising the premise energy router of claim 21, the system further comprising a distribution transformer that is spaced apart from the premise energy router and that serves the premise of the customer.

23. The premise energy router of claim 21, wherein the premise energy router is connected between the utility secondary service of the electric utility and a wiring connection of the customer at the premise of the customer.

* * * * *